United States Patent
Gronemeyer

(10) Patent No.: US 8,571,506 B2
(45) Date of Patent: Oct. 29, 2013

(54) SYSTEMS AND METHODS FOR SHARING AN OSCILLATOR BETWEEN RECEIVERS

(75) Inventor: Steven G. Gronemeyer, Cedar Rapids, IA (US)

(73) Assignee: CSR Technology Inc., San Jose, CA (US)

( * ) Notice: Subject to any disclaimer, the term of this patent is extended or adjusted under 35 U.S.C. 154(b) by 1464 days.

(21) Appl. No.: 11/926,474

(22) Filed: Oct. 29, 2007

(65) Prior Publication Data

US 2009/0109087 A1   Apr. 30, 2009

(51) Int. Cl.
*H04B 7/00* (2006.01)
*H04B 1/06* (2006.01)

(52) U.S. Cl.
USPC .......................................... 455/264; 455/255

(58) Field of Classification Search
USPC .................................. 455/255–265
See application file for complete search history.

(56) References Cited

U.S. PATENT DOCUMENTS

| | | | |
|---|---|---|---|
| 6,411,892 B1 | 6/2002 | Van Diggelen | |
| 6,417,801 B1 | 7/2002 | Van Diggelen | |
| 6,429,814 B1 | 8/2002 | Van Diggelen et al. | |
| 6,453,237 B1 | 9/2002 | Fuchs et al. | |
| 6,484,097 B2 | 11/2002 | Fuchs et al. | |
| 6,487,499 B1 | 11/2002 | Fuchs et al. | |
| 6,510,387 B2 | 1/2003 | Van Diggelen | |
| 6,542,820 B2 | 4/2003 | LaMance et al. | |
| 6,560,534 B2 | 5/2003 | Abraham et al. | |
| 6,606,346 B2 | 8/2003 | Abraham et al. | |
| 6,704,651 B2 | 3/2004 | Van Diggelen | |
| 7,773,034 B2 * | 8/2010 | Levy | 342/357.31 |
| 2004/0214538 A1 * | 10/2004 | Ballantyne et al. | 455/141 |
| 2008/0198070 A1 * | 8/2008 | Wang et al. | 342/357.12 |

* cited by examiner

*Primary Examiner* — Christian Hannon
(74) *Attorney, Agent, or Firm* — RatnerPrestia

(57) ABSTRACT

Systems and methods for sharing an oscillator between receivers are disclosed. A representative method (among others) of responding to a change in frequency of a voltage-controlled temperature-compensated oscillator (VCTCXO), includes: determining a new value for VCTCXO frequency; determining a time at which the new value will be applied to the VCTCXO; transmitting the time and the new value to a subsystem that uses a second receiver which shares the VCTCXO with a first receiver; and in the subsystem, updating channel context data to use the time of the change in frequency and the new value.

18 Claims, 6 Drawing Sheets

SYSTEMS AND METHODS FOR SHARING AN OSCILLATOR BETWEEN RECEIVERS

TECHNICAL FIELD

The present disclosure is generally related to signal processing and, more particularly, is related to systems and methods for sharing an oscillator between receivers.

BACKGROUND

Typically, a global positioning system (GPS) receiver can provide a user with a position, velocity, and time (PVT) solution, sometimes referred to as a navigation solution. The GPS receiver typically incorporates current measurements from four or more satellites to update its most recent navigation solution. The GPS receiver is often combined with another receiver, such as a wireless receiver, to form a larger system such as a mobile phone. To save on cost and power, it is desirable to have both receivers derive radio frequency and clock signals from a relatively inaccurate common reference. The wireless receiver typically overcomes this inaccuracy by tracking a base station carrier, and then using an automatic frequency control system to correct the reference. However, this solution leaves the GPS receiver with a variable reference frequency which may change during the course of an acquisition and cause acquisition failure. Thus, a heretofore unaddressed need exists in the industry to address the aforementioned deficiencies and inadequacies.

SUMMARY

Systems and methods for sharing an oscillator between receivers are disclosed. A representative method (among others) of responding to a change in frequency of a voltage-controlled temperature-compensated oscillator (VCTCXO), includes: determining a new value for VCTCXO frequency; determining a time at which the new value will be applied to the VCTCXO; transmitting the time and the new value to a subsystem that uses a second receiver which shares the VCTCXO with a first receiver; and in the subsystem, updating channel context data to use the time of the change in frequency and the new value.

Another representative method, among others, for sharing an oscillator between receivers includes receiving a notification of VCTCXO frequency change. The notification includes a new value and the time at which the new value will be applied to the VCTCXO. The method also includes updating context data associated with one of a plurality of channels to use the time and the new value. The update occurs during a period in which the one channel is idle.

A representative system, among others, include a voltage-controlled temperature-compensated oscillator (VCTCXO) used by a first receiver. The system further includes logic configured to change a frequency used by the VCTCXO to a new value, and logic configured to determine a time for the frequency change. The system further includes a subsystem, where the subsystem includes a second receiver and a processor. The second receiver is configured to obtain a reference frequency from the VCTCXO. The process is configured to receive a plurality of samples from the second receiver and to receive the time of the frequency change and the new value. The processor is further configured to update channel context data with the time of the frequency update and the new value, and to process the plurality of samples in accordance with the channel context data to determine whether a signal is present in one of a plurality of channels.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Exemplary systems are first discussed with reference to the figures. Although these systems are described in detail, they are provided for purposes of illustration only and various modifications are feasible. After the exemplary systems are described, examples of flow diagrams of the systems are provided to explain the manner in which an oscillator is shared between receivers.

Figure 1:
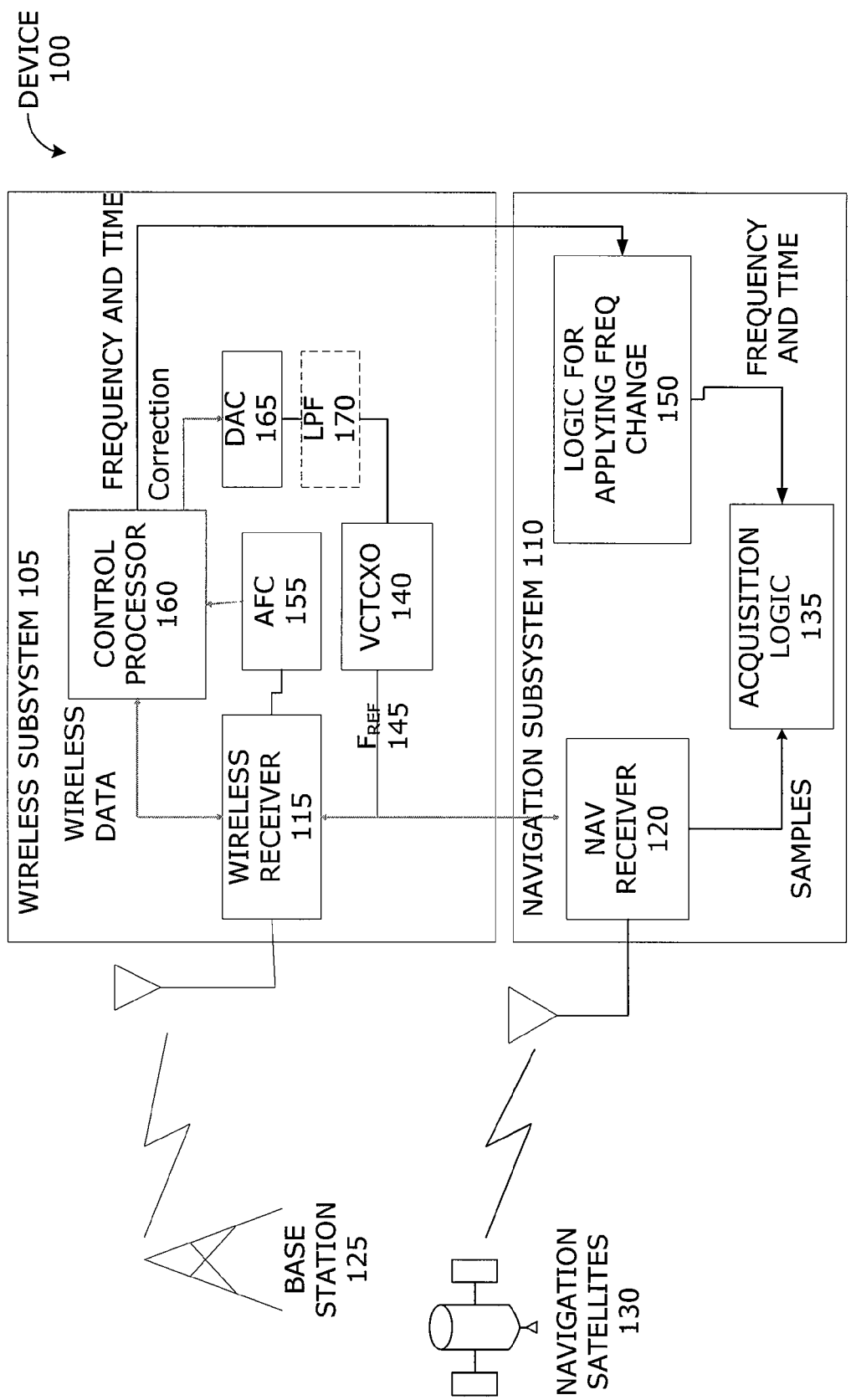
FIG. 1 is a block diagram of an embodiment of a device for sharing an oscillator between receivers.

FIG. 1 is a block diagram of an embodiment of a device for sharing an oscillator between receivers. Device 100 includes two subsystems, a wireless subsystem 105, and a navigation subsystem 110. Each subsystem includes a receiver: wireless subsystem 105 includes wireless receiver 115, and navigation subsystem 110 includes navigation receiver 120. Wireless receiver 115 is in communication with a base station 125. Navigation receiver 120 is in communication with navigation satellites 130.

Acquisition logic 135 within navigation subsystem 110 locates signals from navigation satellites 130 by searching through a set of code phase and frequency bins, and integrating the signal energy found in each bin. If the integrated energy in a particular bin meets a threshold, the signal has been acquired (i.e., the code phase and frequency has been determined) and the search stops. Navigation data carried by the signal can then be extracted and used by other parts of navigation subsystem 110 (not shown). Acquisition is typically performed at power up, when a new satellite rises, and when a satellite signal is lost.

As shown in FIG. 1, both wireless receiver 115 and navigation receiver 120 share a common voltage-controlled, temperature-compensated oscillator (VCTCXO) 140. That is, a reference frequency 145 output by VCTCXO 140 is an input to both wireless receiver 115 and navigation receiver 120. Wireless subsystem 105 also includes a feedback loop to adjust the frequency of VCTCXO 140, in order to correct frequency errors that occur as the reference frequency 145 wanders with respect to the frequency used by base station 125. That is, the feedback loop is used to track the frequency of base station 125.

A VCTCXO frequency change that occurs during an integration performed by acquisition logic 135 may cause the signal energy to shift from one search bin to another. If this happens, the integrated energy in one bin is decreased and the search may fail because not enough energy is integrated in any one bin for the signal to be detected. To avoid this problem, device 100 includes logic for applying frequency change 150, which insures that the frequency relationship between the received signal and the search bins does not change during the integration time. Logic 150 will now be discussed in conjunction with the VCTCXO feedback loop.

In the example of FIG. 1, this feedback loop is implemented as follows. Wireless receiver 115 provides input to automatic frequency control (AFC) logic 155. AFC 155 provides an error signal to a control processor 160. Control processor 160 provides a corrected frequency, in digital form, to digital-to-analog converter (DAC) 165. DAC 165 provides the corrected frequency, in analog form, to VCTCXO 140. The corrected analog frequency may pass through optional low pass filter 170. When control processor 160 determines a new corrected frequency to be applied to shared VCTCXO 140, then this new frequency is also provided to acquisition logic 135, along with the time at which the corrected frequency will be applied to VCTCXO 140. A person of ordinary skill in the art should appreciate that any number of mechanisms can be used to communicate the frequency and time information from control processor 160 to acquisition logic 135, including, for example, a message 180 sent over a serial port or a local bus (not shown).

Figure 2:
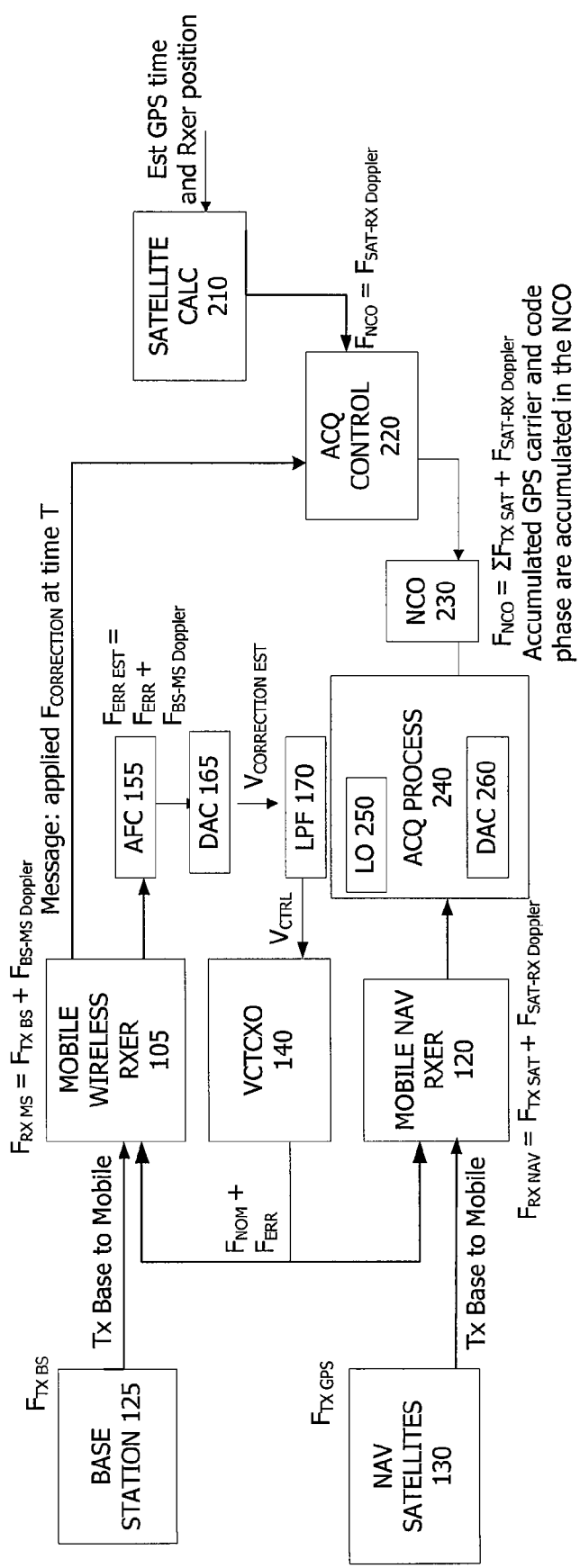
FIG. 2 block diagram showing selected components of one embodiment of the device from FIG. 1.

FIG. 2 is a block diagram showing selected components of one embodiment of the device 100 (from FIG. 1), in more detail. As described earlier, wireless subsystem 105 and navigation subsystem 110 share VCTCXO reference frequency 145, and message 180 from wireless subsystem 105 informs navigation subsystem 110 that a frequency correction will be, or has been, applied at a particular point in time.

Navigation receiver 120 includes acquisition logic 135 which processes signal samples during satellite acquisition. Acquisition logic 135 includes satellite calculation logic 210, acquisition control logic 220, numerical controlled oscillator (NCO) 230, and acquisition processing logic 240. Acquisition processing logic 240 includes a down converter local oscillator (LO) 250 and a digital-analog converter (DAC) 260, where the frequency of LO 250 and the sample rate of DAC 260 are based on VCTCXO reference frequency 145.

When processing signal samples from DAC 260, acquisition processing logic 240 takes into account errors in both subsystems. Some drift in reference frequency 145 results from factors such as the crystal's imperfect compensation for temperature effects on the crystal frequency, and imperfect tracking of base station signal by mobile station in the AFC control loop. This drift in turn results in frequency errors in the samples. Line-of-sight (LOS) Doppler errors caused by relative motion between navigation receiver 120 and navigation satellites 130 also cause errors in the samples.

NCO 230 takes these VCTCXO errors and navigation Doppler errors into account when controlling carrier and code phase in acquisition processing logic 240. As explained earlier, information about the error in VCTCXO reference frequency 145 comes from wireless subsystem 105, since that subsystem has the AFC loop and has knowledge of the time for the change in the VCTCXO control voltage. Navigation receiver 120 tracks the changes and applies them to NCO 230 to stabilize the acquisition search bins (introduced earlier in connection with FIG. 1 and discussed in more detail below).

Navigation receiver 120 also applies terms to compensate for the changes in the LOS Doppler between the receiver and the particular navigation satellite 130 that is currently being processed by acquisition processing logic 240. Navigation receiver 120 is able to calculate those navigation LOS Doppler values on its own as a function of time, using its estimate of navigation system time, receiver position and the ephemeris data of that particular navigation satellite 130 (which defines the orbit of a given satellite as a function of time). The orbital calculations determine exactly where the satellite is at each instant, so that the change in range (LOS distance) as a function of time can be used to determine LOS Doppler.

The combined information about the VCTCXO frequency error and the navigation system LOS Doppler can then be applied to NCO 230 to stabilize the search bins during acquisition. Note that the VCTCXO error term applies to all satellites in common, while each satellite has a unique Doppler term. Therefore, these values are changed out as each satellite is processed in turn.

Figure 3:
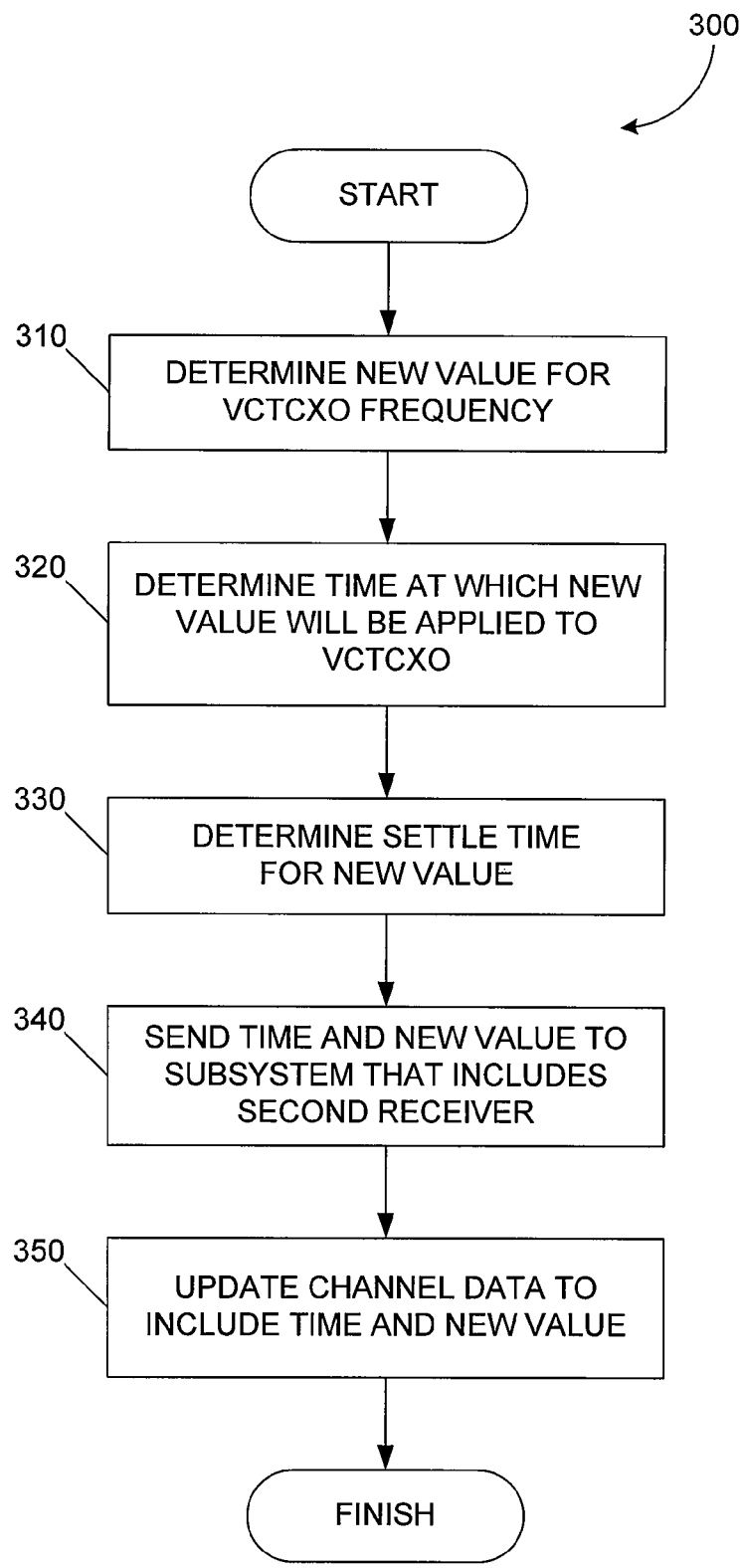
FIG. 3 is a flowchart of a process performed by one embodiment of the logic for applying frequency change of FIG. 1.

FIG. 3 is a flowchart of a process performed by one embodiment of logic for applying frequency change 150. Process 300 is performed in a device that shares the VCTCXO between wireless receiver 115 and navigation receiver 120. Process 300 begins at block 310, which determines a new value for VCTCXO frequency. Next, block 320 determines a time that the new value will be applied to the VCTCXO (i.e., an update time). Optional block 330 determines a time required for this change to take effect (settle). Processing continues at block 340, which sends the determined frequency, update time, and (optionally) settle time to navigation subsystem 110. Process 300 completes with block 350, which updates channel data used in the acquisition search to include the new frequency, the frequency update time, and (optionally) settle time. Further details of the update to channel data will now be described.

Each satellite signal being acquired is represented by a "channel". Because acquisition of a channel requires a relatively large amount of sample data—on the order of a few seconds—the process is broken down into smaller intervals: channel X acquisition executes for a relatively short interval (sometimes called a "slice") to process a small portion of the sample data, then channel Y acquisition executes to process a small portion, etc. The same samples are processed for many channels in sequence by this context switching among channels. Acquisition of the various channels continues in this alternating fashion, and as the integration signal threshold is reached on a particular channel that channel stops executing. A channel may also stop executing when a timeout occurs. In this manner, each channel typically experiences many execution slices (context switches), using a few milliseconds of real time samples each, with a cumulative equivalent real time span of up to several seconds. Using inventive techniques described herein, the update to channel data for a new VCTCXO frequency is performed before or after the execution of the channel in which the change occurs.

Figure 4:
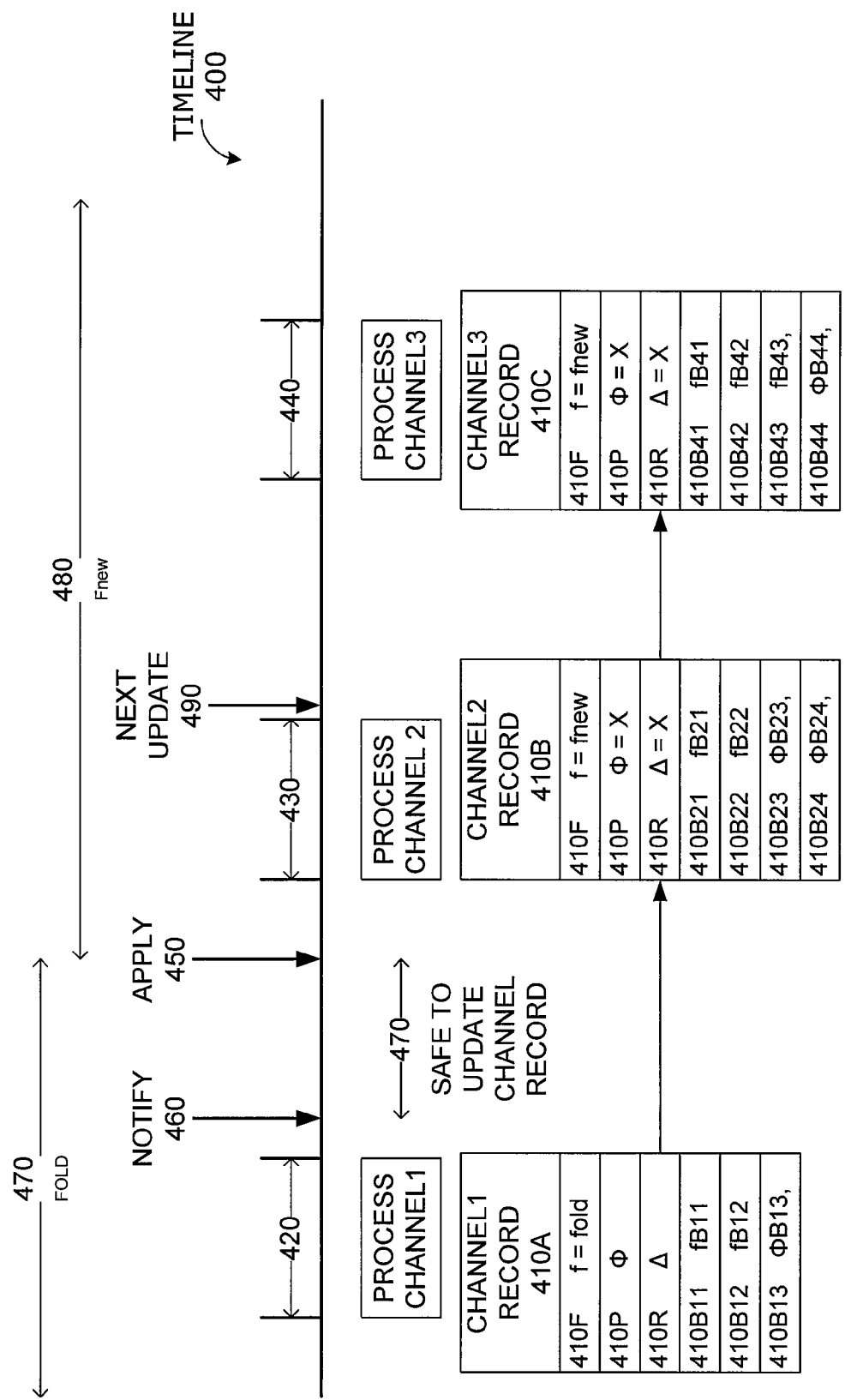
FIG. 4 is a timeline diagram illustrating how context data associated with search bins is used by one embodiment of the navigation subsystem of FIG. 1.

FIG. 4 is a timeline diagram illustrating how channel data is updated in one embodiment of navigation subsystem 110. Each channel (particular satellite) is represented by a channel record 410. Channel records 410 are used as context data when acquisition logic 135 executes. That is, navigation subsystem 110 periodically executes acquisition logic 135, and each time acquisition logic 135 executes, logic 135 uses one of the channel records 410 (i.e., a "current" channel record). In some embodiments, on-chip firmware, microcode, or a hardware state machine is responsible for loading and unloading channel context data from memory to special registers, and acquisition logic 135 accesses these channel record parameters via those registers.

The example embodiment of FIG. 4 illustrates three channel records 410A-C, linked into a list. Timeline 400 shows acquisition logic 135 executes to process channel 1 during time 420, channel 2 during time 430, and channel 3 during time 440.

Each channel record 410 includes a set of bins 410B which define the search parameters for an execution slice for that channel, where the search bins are defined in terms of frequency and phase. Each search bin 410B represents a possible "location", in frequency and phase, for the satellite signal associated with the channel. Using the parameters of search bin 410B, acquisition logic 135 examines samples stored in a buffer (not shown), and integrates the signal energy of the samples. As described before, if the integrated signal reaches a threshold, that channel stops executing.

Each channel record 410 also includes a reference frequency 410F and a rate of change for the reference frequency 410R (also known as drift rate). These items correspond to the frequency and rate of frequency change for shared VCTCXO 140 discussed above. Each channel record 410 also includes a reference code phase 410P, which corresponds to the code phase for shared VCTCXO 140 that was discussed above. Acquisition logic 135 uses these local reference values associated with the channel during integration. As described above, if the frequency of VCTCXO 140 changes during this integration, the signal energy may shift from one search bin to another, and the search may fail because not enough energy is integrated in any one bin for signal detection to succeed. The inventive techniques describe herein overcome this problem by updating acquisition logic 135 with new values for the VCTCXO frequency change.

However, reference frequency 410F, code phase 410P, and/or frequency rate 410R in a channel record 410 can only be updated between execution slices, while that channel is idle. Therefore, logic for applying frequency change 150 updates the frequency, code phase and/or frequency rate for a new VCTCXO value before or after acquisition logic 135 processes a channel. In other words, logic for applying frequency change 150 avoids updating channel record 410 during the time acquisition logic 135 is using the channel for a search, and instead updates channel record 410 when the channel is idle. An overview of determining appropriate times for updating channel records 410 will now be described, with more detail discussed below in connection with FIG. 5.

In the example scenario of FIG. 4, the frequency used by VCTCXO 140 is changed to a new value $f_{new}$ at time 450. At time 460—before the frequency application time 450—logic for applying frequency change 150 receives a notification (e.g., from control processor 160) containing the new value $f_{new}$ and the time (450). Thus, $f_{new}$ can be considered time-tagged data. During time range 470 the old value $f_{old}$ is in use by VCTCXO 140 and during time range 480 the new value $f_{new}$ is in use. Between notification time 460 and application time 450, logic 150 determines which channel(s) will be processed after application time 450, and updates the channel record 410 for those channels.

Some embodiments of logic for applying frequency change 150 also update the channel record 410 for channel(s) which have already been processed at application time 450—for example, suppose that application time 450 occurred during processing of channel 2 rather than before. In this case, the next opportunity for an update to the record for channel 2 would be at time 490. Between application time 450 and next update time 490, channels have (essentially) not been collecting the right energy. Although logic 150 does not correct for the integration of data samples that has already occurred, updating the channel 2 record at next update time 490 is still useful, since the acquisition process works on large numbers of samples, and updating at time 490 will insure that future samples integrated by acquisition logic 135 use the appropriate (updated) reference frequency.

A person of ordinary skill in the art should appreciate that the time between receiving a notification that a frequency update will occur (time 460) and the time the frequency is applied (time 450) is system and design-specific, depending on the factors such as transmission time delay, interrupt response times, processing times, etc. Times on the order of a few tens of milliseconds to a few hundred milliseconds might be typical.

In some embodiments, the portion of logic for applying frequency change 150 which updates channel records 410 at appropriate times is implemented by software. In other embodiments, this update logic is implemented by on-chip firmware, microcode, or a hardware state machine, which may also be responsible for loading and unloading channel context data from memory to special registers.

Determining appropriate times for updating channel records 410 will now be described in more detail in connection with FIG. 5. An acquisition clock signal 510 clocks samples converted by DAC 165, which are stored in a buffer 520. In the example scenario of FIG. 5, there are 3 channels, and the acquisition proceeds in a round-robin manner as follows: channel 1 processes the first ms of data in buffer 520; channel 2 processes the first ms of data; channel 3 processes the first ms of data; channel 1 processes the second ms of data; channel 2 processes the second ms of data; channel 3 processes the second ms of data;

Values are periodically written to DAC 165. At a time with a known relationship to this write time for DAC 165, an acquisition clock counter 530 latches the clock. Therefore, counter 530 can be viewed as an index into the received sample stream. When acquisition logic 135 executes for a slice, and processes a portion of samples in buffer 520, the counter value of the last sample processed during that slice is stored in channel record 410. In the example of FIG. 5, this value is stored as LastSampleClock 410S.

Acquisition logic 135 examines the of channel records 410 (e.g., traverses a linked list) and determines when buffer 520 has filled up again with a new "slice" worth of data. That is, the current value of acquisition clock counter 530 informs logic 150 about the latest sample added to buffer 520, and channel-specific LastSampleClock 410S informs logic 150 about the last sample already processed. The difference between these two counters represents the number of unprocessed samples for a particular channel. Since a slice is always the same fixed amount of time, a "slice" worth of samples is available for a particular channel when the difference between the running counter 530 and the channel-specific latched counter 410S is greater than a predetermined threshold. For example, if 48 samples are processed in a slice, then a channel is ready to be processed when the difference in counter values is 48.

As described above, in connection with FIG. 4, logic for applying frequency change 150 in navigation subsystem 110 receives a notification from wireless subsystem 105 containing the new values for frequency and phase of VCTCXO 140, the time at which the new values will be applied, and (optionally) about the rate of change in frequency and phase. Wireless subsystem 105 also provides a timing edge to navigation subsystem 110. When the timing edge occurs, navigation subsystem 110 stores the current value of (latches) the acquisition clock counter 530. A known relationship exists between the time of the edge and the time value contained in the message, and this known relationship allows navigation subsystem 110 to compute when the application time for the new frequency (450 in FIG. 4) occurs relative to the latched acquisition clock counter 530. This computation in turn allows logic 150 to determine which channel(s) will be processed after application time, and to update the channel record 410 for those channels.

More specifically, once the application time 450 has been converted to be relative to acquisition clock counter 530, the same counter information used by acquisition logic 135 to determine when to process a particular channel also informs logic for applying frequency change 150 about when a particular channel will be processed. This allows logic 150 to determine which channel records 410 should be updated with new values for reference frequency 410F, phase 410P, and rate 410R. Logic 150 checks the start time of the next execution of each channel record 410 (start time computed from LastSampleClock 410S), and compares this value the current time to determine if it is safe to update. When not enough time remains between the current time and the next execution time for an update to occur, logic 150 stops updating, and the update process is delayed until the following cycle of execution times.

In some embodiments, interlocking semaphores (e.g., flags updated by hardware logic and flags updated by software code) are used to control access to channel records 410 logic 150, where logic 150 follows the linked list of channel records 410 until the Busy flag in one of the records is set. At that point, logic 150 waits to continue the updates. Other embodiments use hardware-assisted updates, where software code writes a buffer of instructions and/or data and the update instructions are applied by a hardware state machine.

This procedure involving a single update to channel records 410 is preferred when settling time for the updated VCTCXO frequency is less than the time for a slice. Some embodiments handle a settling time that spans a number of slices by taking into account the rate of change to frequency. In these embodiments, logic for applying frequency change 150 updates channel record reference values (frequency 410F and phase 410P) periodically, so that the reference values used by the channel acquisition process are slewed as the VCTCXO frequency slews to its new value.

In other embodiments, only the frequency drift rate is updated. However, this information alone is enough to handle a settling time that spans a number of slices. Since a change in the VCTCXO frequency changes the rate at which those values of phase are accumulated, over time a value of frequency rate will integrate to change carrier frequency, and an integration of carrier frequency will integrate to accumulated carrier phase and code phase. The change in VCTCXO frequency or rate is applied, negatively (after the fact), to reverse the change in phase that would have occurred and would have caused the drift in the code phase and frequency search bins. This double integration approach tracks the distributed application of the total change over the time of application, due to the smoothing effects of a filter.

As described above, navigation subsystem 110 use a latch to capture the time at which a frequency change will be applied. Some embodiments latch every frequency change, and send a corresponding notification to logic for applying frequency change 150 every time. However, since VCTCXO 140 is shared by wireless subsystem 105 and navigation subsystem 110, other embodiments latch the timing edge only at the time of the first frequency change. Subsequent changes to VCTCXO frequency result in a message containing the new frequency and a common time tag, but no additional latch. These single latch embodiments are appropriate whenever the timing chains of the two subsystems maintain coherence.

The relationship between the timing edge provided by wireless subsystem 105 to navigation subsystem 110, and the time value contained in the "VCTCXO frequency is changing" message, described briefly above, will now be discussed in more detail. Since wireless subsystem 105 and navigation subsystem 110 share the VCTCXO clock, these two subsystems do in fact run at the same rate, so the difference between the timing edge and the time value in the message can be determined. In some embodiments, wireless subsystem 105 and/or navigation subsystem 110 create clocks using numerically controlled oscillators (NCOs) that run at rates different than the raw VCTCXO rate. Even so, the difference can still be computed since the parameters of these NCOs are known as part of the design, and any points in time where the parameters change are also known by the subsystems.

In summary, the latched acquisition clock count, and the use of this count to index into the sample stream to determine channel execution times and to interpret message times for change to VCTCXO frequency are all related in the inventive design disclosed herein. This relationship allows logic for applying frequency change 150 to determine at which point in the sample stream the frequency change will take effect, and when any given channel's processing will be affected. Then, as described earlier, each channel record is used to compute that channel's next execution time. This next execution time is used to determine when, and by what amounts, the reference frequency and phase in the channel record is updated.

The discussion above considered signal acquisition. However, the principles can be used during tracking also. The same use of time tagged VCTCXO data will be useful in when tracking very weak signals. The time tagged data permits tracking loop bandwidth to deal more effectively with other system dynamics if the VCTCXO changes can be removed using time tagged information from the wireless subsystem.

Figure 6:
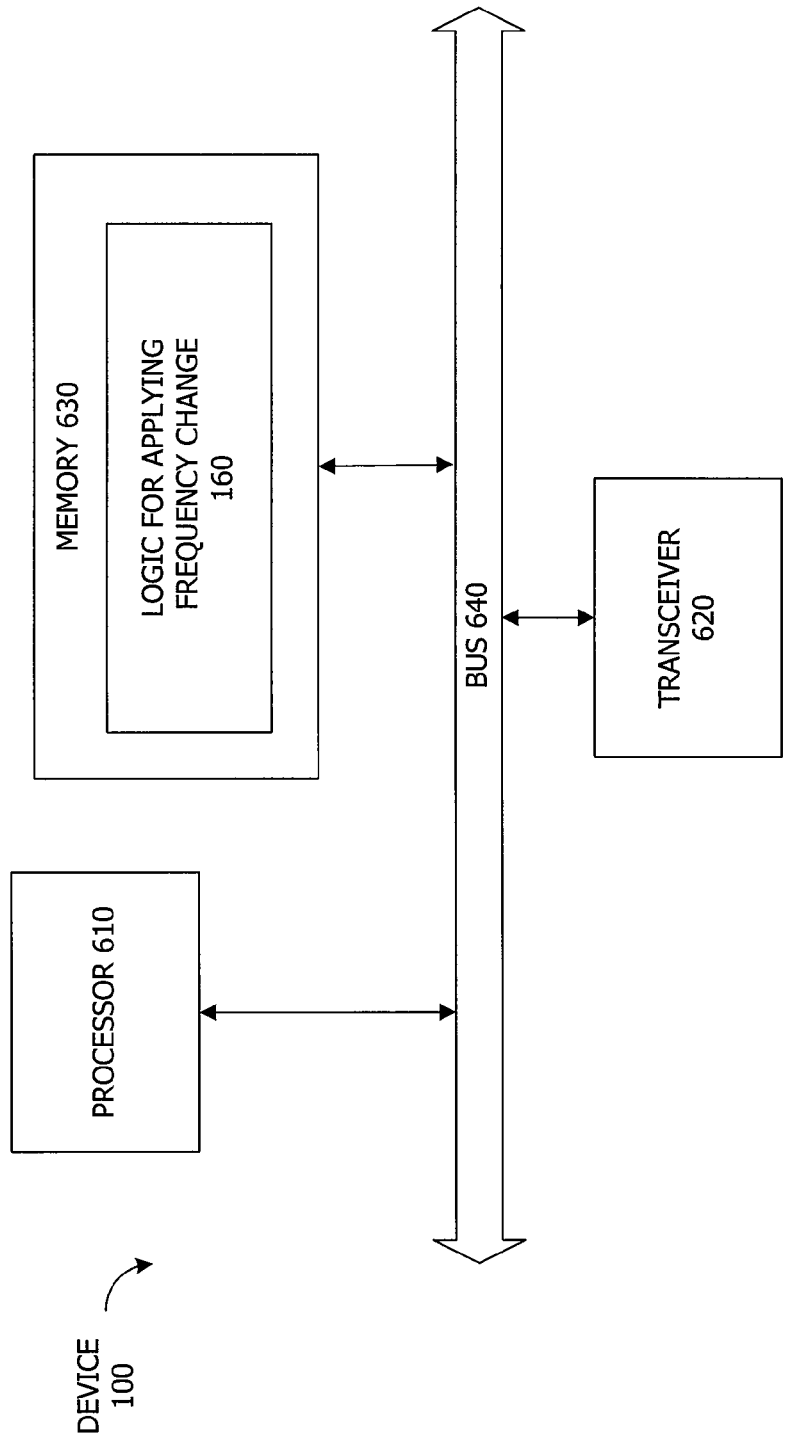
FIG. 6 is a hardware block diagram of a general-purpose computing device which can be used to implement the wireless subsystem and/or navigation subsystem of FIG. 1.

FIG. 6 is a hardware block diagram of a device 600 which can be used to implemented wireless subsystem 105 and/or navigation subsystem 110. Device 600 contains a number of components that are familiar to a person of ordinary skill in the art, including a processor 610, a transceiver 620, and memory 630. These components are coupled via bus 640. Memory 630 contains instructions which, when executed by processor 610, implements logic for applying frequency change 150 from FIG. 1. Omitted from FIG. 6 are a number of conventional components that are not necessary to explain the operation of device 600.

Device 100, device 600, and method 300, can be implemented in software, hardware, or a combination thereof. In some embodiments, the device, system, and/or method is implemented in software that is stored in a memory and that is executed by a suitable microprocessor, network processor, or microcontroller situated in a computing device. In other embodiments, the device, system and/or method is implemented in hardware, including, but not limited to, a programmable logic device (PLD), programmable gate array (PGA), field programmable gate array (FPGA) or an application-specific integrated circuit (ASIC).

Device 100, device 600, and method 300, can be embodied in any computer-readable medium for use by or in connection with an instruction execution system, apparatus, or device. Such instruction execution systems include any computer-based system, processor-containing system, or other system that can fetch and execute the instructions from the instruction execution system. In the context of this disclosure, a "computer-readable medium" can be any means that can contain, store, communicate, propagate, or transport the program for use by, or in connection with, the instruction execution system. The computer readable medium can be, for example but not limited to, a system or propagation medium that is based on electronic, magnetic, optical, electromagnetic, infrared, or semiconductor technology.

Specific examples of a computer-readable medium using electronic technology would include (but are not limited to) the following: an electrical connection (electronic) having one or more wires; a random access memory (RAM); a read-only memory (ROM); an erasable programmable read-only memory (EPROM or Flash memory). A specific example using magnetic technology includes (but is not limited to) a portable computer diskette. Specific examples using optical technology include (but are not limited to) an optical fiber and a portable compact disk read-only memory (CD-ROM).

The foregoing description has been presented for purposes of illustration and description. It is not intended to be exhaustive or to limit the disclosure to the precise forms disclosed. Obvious modifications or variations are possible in light of the above teachings. The implementations discussed, however, were chosen and described to illustrate the principles of the disclosure and its practical application to thereby enable one of ordinary skill in the art to utilize the disclosure in various implementations and with various modifications as are suited to the particular use contemplated. All such modifications and variation are within the scope of the disclosure as determined by the appended claims when interpreted in accordance with the breadth to which they are fairly and legally entitled.

Therefore, at least the following is claimed:

1. A method of responding to a change frequency of a voltage-controlled temperature-compensated oscillator (VCTCXO) shared by a first and a second receiver in a device, the method comprising the steps of:
   determining a new value for the VCTCXO frequency;
   determining a usage time range during which the second receiver is using the VCTCXO;
   updating the VCTCXO with the new value before the usage time range if it is determined that updating before the usage time range will not overlap the usage time range; and
   updating the VCTCXO with the new value after the usage time range if it is determined that updating before the usage time range will overlap the usage time range.

2. The method of claim 1, further comprising the step of:
   latching a first time related to a second time at which the new value is stored in a digital-to-analog-converter located in the first receiver.

3. The method of claim 1, further comprising the step of:
   latching a time at which the new value is written to a digital-to-analog-converter located in the first receiver.

4. The method of claim 1, further comprising the step of:
   at a time at which the new value is stored to a digital-to-analog-converter located in the first receiver, latching an index into a received sample stream.

5. The method of claim 1, the updating comprising:
   during the execution of a slice, storing a value of a counter of a last sample processed during the slice in one of a plurality of channel records.

6. The method of claim 5, the updating further comprising:
   determining when a buffer is full of a slice by examining the channel records.

7. The method of claim 6, the updating further comprising:
   computing a difference between a current value of the counter and the stored value of the counter.

8. The method of claim 7, the updating further comprising:
   determining the time range during which the channel is in use based on the computed difference.

9. A method of responding to a change in frequency of a voltage-controlled temperature-compensated oscillator (VCTCXO) shared by a first and a second receiver in a device, the method comprising:
   receiving, by the second receiver, a notification of VCTCXO frequency change, the notification including a new value and an update time at which context data will be updated and the new value will be applied to the VCTCXO,
   setting the update time to occur before a usage time range when the VCTCXO is in use, if it is determined that updating the VCTCXO before the usage time range will not overlap the usage time range, and
   setting the update time to occur after the usage time range if it is determined that updating the VCTCXO before the usage time range will overlap the usage time range.

10. The method of claim 9, further comprising the steps of:
    determining a time range during which the channel context data is in use for acquisition; and
    updating the channel context data at a time which is outside of the determined time range.

11. The method of claim 9, further comprising the steps of:
    determining a time range during which the channel context data is in use; and
    updating the channel context data at a time which is outside of the determined time range.

12. The method of claim 9, further comprising the step of:
    searching a plurality of frequency bins for detected signal energy greater than a threshold value, the plurality of frequency bins being at least partially defined by the channel context data.

13. A system comprising:
    a voltage-controlled temperature-compensated oscillator (VCTCXO) used by a first receiver;
    logic configured to change a frequency used by the VCTCXO to a new value;
    logic configured to determine an update time for the frequency change;
    a subsystem comprising:
      a second receiver configured to obtain a reference frequency from the VCTCXO;
      a processor configured to:
        receive a plurality of samples from the second receiver;
        receive the update time of the frequency change and the new value;
        setting the update time to occur before a usage time range when the VCTCXO is in use, if it is determined that updating the VCTCXO before the usage time range will not overlap the usage time range,
        setting the update time to occur after the usage time range if it is determined that updating the VCTCXO before the usage time range will overlap the usage time range; and
        process the plurality samples in accordance with the channel context data to determine whether a signal is present in one a plurality of search bins, the plurality of search bins at least partially defined by the channel context data.

14. The system of claim 13, wherein the processor is further configured to:

convert the time of the frequency change from a first timescale used by the first receiver to a second timescale used by the second receiver.

15. The system of claim 13, wherein the processor is further configured to:
converting the time of the frequency change to a corresponding time relative to a local clock used by the second receiver.

16. The system of claim 13, further comprising:
a counter configured to index into the received samples; and
a latch configured to store the value of the counter at a first time related to a second time at which the new value is written to a digital-to-analog-converter located in the first receiver.

17. The system of claim 13, further comprising:
a counter configured to index into the received samples; and
a latch configured to store the value of the counter at a time at which the new value is written to a digital-to-analog-converter located in the first receiver.

18. A device comprising:
a receiver receiving a notification of a change in a reference frequency shared by a first and a second receiver, the notification including a new value and the time at which the new value will be applied to a VCTCXO;
a processor processing a set of samples derived from a received satellite signal, using context data associated with a plurality of channels, to determine whether the received satellite signal has been acquired;
updating the VCTCXO with the new value before a usage time range when the VCTCXO is in use by one of the plurality of channels, if it is determined that updating before the usage time range will not overlap the usage time range; and
updating the VCTCXO with the new value after the usage time range if it is determined that updating before the usage time range will overlap the usage time range.

* * * * *

UNITED STATES PATENT AND TRADEMARK OFFICE
CERTIFICATE OF CORRECTION

Page 1 of 2

PATENT NO. : 8,571,506 B2
APPLICATION NO. : 11/926474
DATED : October 29, 2013
INVENTOR(S) : Gronemeyer It is certified that error appears in the above-identified patent and that said Letters Patent is hereby corrected as shown below:

On the Title Page

Item (75), under "Inventor", in Column 1, Line 1, delete "Steven G. Gronemeyer," and insert -- Steven A. Gronemeyer, --, therefor.

In the Drawings

In Fig. 4, Sheet 4 of 6, under "410C", Line 1, delete "f=fnew" and insert -- $f=f_{new}$ --, therefor.

In Fig. 4, Sheet 4 of 6, under "410B", Line 1, delete "f=fnew" and insert -- $f=f_{new}$ --, therefor.

In Fig. 4, Sheet 4 of 6, delete " $\underline{470}$ FOLD " and insert -- $\underline{470}$ $F_{OLD}$ --, therefor.

In Fig. 4, Sheet 4 of 6, under "410A", Line 1, delete "f=fold" and insert -- $f=f_{old}$ --, therefor.

Figure 5:
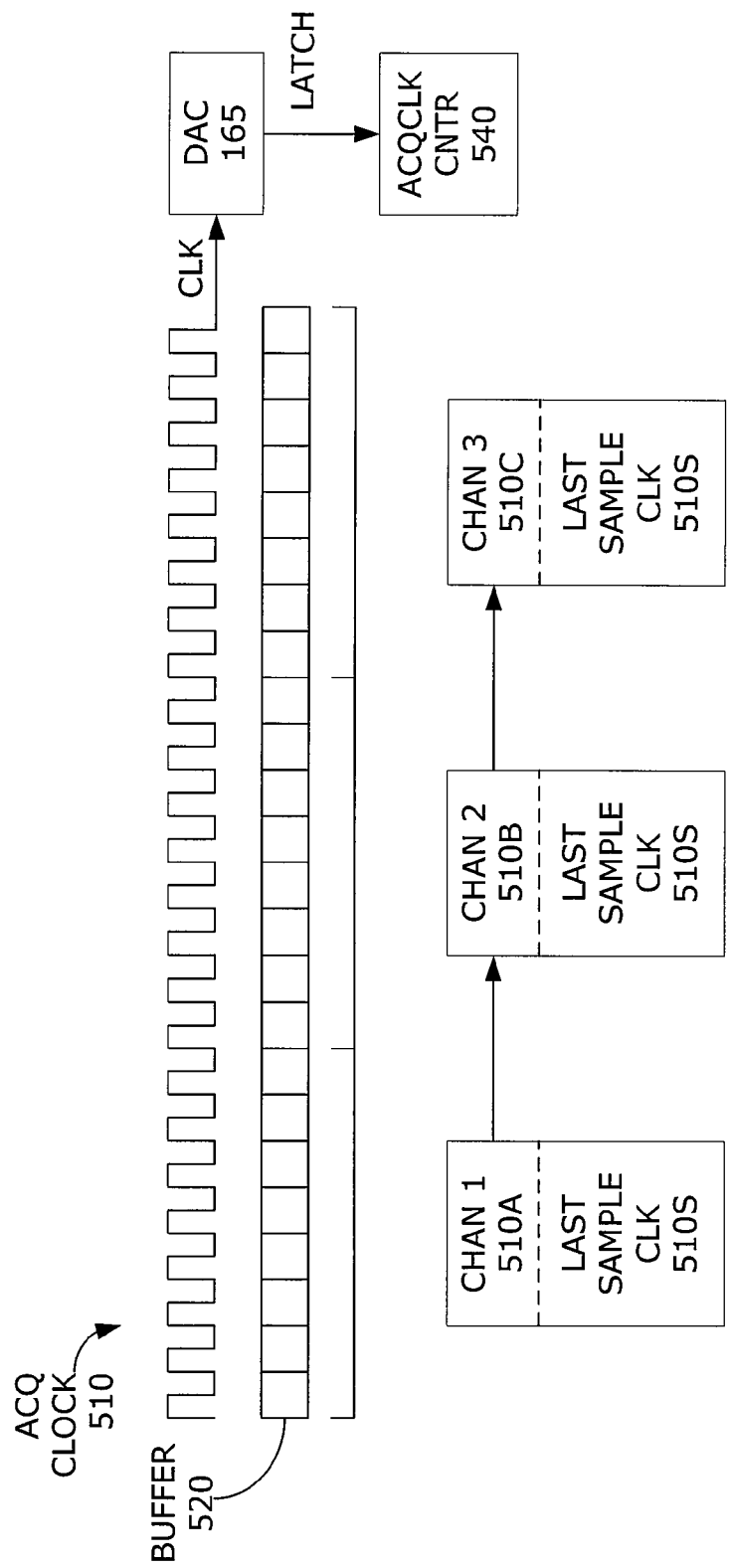
FIG. 5 illustrates how times for updating channel records are determined in one embodiment of the navigation subsystem of FIG. 1.

In Fig. 5, Sheet 5 of 6, delete "540" and insert -- 530 --, therefor.

In Fig. 5, Sheet 5 of 6, delete " 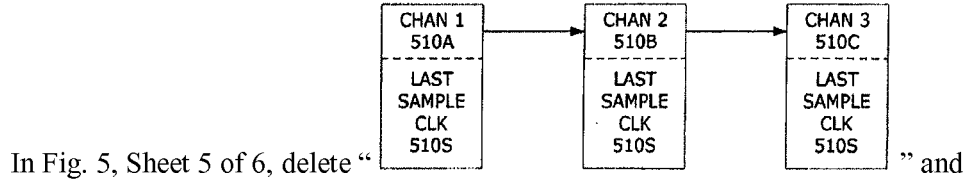 " and

Signed and Sealed this
Third Day of June, 2014

Michelle K. Lee
*Deputy Director of the United States Patent and Trademark Office*

CERTIFICATE OF CORRECTION (continued)
U.S. Pat. No. 8,571,506 B2 insert -- 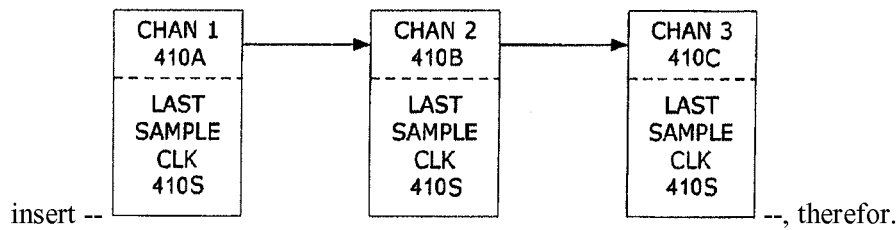 --, therefor.

In Fig. 6, Sheet 6 of 6, delete "160" and insert -- 150 --, therefor.

In Fig. 6, Sheet 6 of 6, delete main designator "100" and insert main designator -- 600 --, therefor.

In the Specification

In Column 6, Line 36, delete "data;" and insert -- data. --, therefor.

In the Claims

In Column 9, Line 62, in Claim 5, delete "during the execution" and insert -- during execution --, therefor.

In Column 10, Line 61, in Claim 13, delete "accordance with the" and insert -- accordance with --, therefor.